US012803303B2

(12) United States Patent
Kadirvel et al.

(10) Patent No.: US 12,803,303 B2
(45) Date of Patent: Nov. 17, 2026

(54) BATTERY ANOMALY DETECTION SYSTEM

(71) Applicant: Meta Platforms Technologies, LLC, Menlo Park, CA (US)

(72) Inventors: Karthik Kadirvel, Cupertino, CA (US); Ankur Gupta, Redwood City, CA (US); Eugene Kropp, Aptos, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 661 days.

(21) Appl. No.: 18/229,625

(22) Filed: Aug. 2, 2023

(65) Prior Publication Data

US 2024/0072548 A1 Feb. 29, 2024

Related U.S. Application Data

(60) Provisional application No. 63/401,805, filed on Aug. 29, 2022.

(51) Int. Cl.

| | |
|---|---|
| ***H02J 7/60*** | (2026.01) |
| ***G01R 31/389*** | (2019.01) |
| ***H01M 50/569*** | (2021.01) |

(52) U.S. Cl.

CPC .............. *H02J 7/60* (2026.01); *G01R 31/389* (2019.01); *H01M 50/569* (2021.01)

(58) Field of Classification Search

CPC ........ H02J 7/60; G01R 31/389; H01M 50/569

See application file for complete search history.

(56) References Cited

U.S. PATENT DOCUMENTS

| | | | |
|---|---|---|---|
| 10,073,143 | B2 | 9/2018 | Leidich et al. |
| 11,313,910 | B2 | 4/2022 | Isa et al. |
| 11,394,215 | B1 | 7/2022 | Bhagwan |
| 2012/0062238 | A1 | 3/2012 | Kawasaki et al. |
| 2021/0190471 | A1 | 6/2021 | Ikeda et al. |

(Continued)

FOREIGN PATENT DOCUMENTS

CN 111736085 B * 11/2023 ........... G01R 31/392

OTHER PUBLICATIONS

Locorotondo et al., Development of a battery real-time state of health diagnosis based on fast impedance measurements, 38 J of Energy Storage (Year: 2021).*

(Continued)

*Primary Examiner* — Jordan L Jackson

(74) *Attorney, Agent, or Firm* — McDermott Will & Schulte LLP

(57) ABSTRACT

For electronic devices that have an electrically conductive surface across a gap from a battery enclosure, the described circuit may be used to detect an anomalous event. The circuit may connect the battery enclosure to ground and may include a switch that operably connects the electrically conductive surface to ground or, upon actuation of the switch, to a portion of the circuit including a resistor. In an anomaly detection mode, the switch is controlled to disconnect the surface from ground and to connect the surface to a resistance measurement channel and a resistor that is connected to the sub-circuit and ground. The system may determine an impedance across the resistor and may use the measured impedance to detect and/or classify an anomalous event.

20 Claims, 5 Drawing Sheets

(56) References Cited

U.S. PATENT DOCUMENTS

2023/0184839 A1* 6/2023 Murphy .............. G01R 31/367
702/63

OTHER PUBLICATIONS

Love et al., Lithium-ion cell fault detection by single-point impedance diagnostic and degradation mechanism validation for series wired batteries cycled at 0 c, 11(834) Energies 1-19 (Year: 2018).*

Naha et al., On-Board Short-Circuit Detection of Li-ion Batteries Undergoing Fixed Charging Profile as in Smartphone Applications, 66(11) IEEE Transactions on Industrial Electronics 8782-8791 (Jan. 3, 2019) (Year: 2019).*

* cited by examiner

BATTERY ANOMALY DETECTION SYSTEM

CROSS-REFERENCE TO RELATED APPLICATION

This application claims the benefit of and claims priority to U.S. Provisional Application No. 63/401,805, filed on Aug. 29, 2022, which is incorporated herein by reference.

BACKGROUND

Many consumer electronic devices utilize batteries as power sources. Batteries tend to swell as a result of ambient and/or internal heat, the latter of which may be caused by energy discharge and/or rapid charging. Some swelling is normal and tolerable, such as due to age, ambient heat, or charging/discharge heat, so consumer electronics tend to include a gap between a battery and a next component to allow some swelling of the battery. However, battery swelling may also be an indication of overheated conditions within the device that may degrade the lifespan of the battery or that may result in the damage of the battery or other components of the device, as the battery swells.

Some battery swelling may even lead to catastrophic failure of the battery, resulting in loss of integrity of the battery and potential damage to other components caused by leakage from the battery or pressure caused by the battery pressing onto other components of the electronic device. Moreover, other events may risk the integrity of the electronic device, such as water or dust ingress into the case of the electronic device, a loose part, or the like, any of which may cause annoyances in using the electronic device or even a failure of the electronic device, if the problem isn't remediated.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Overview

Figure 1:
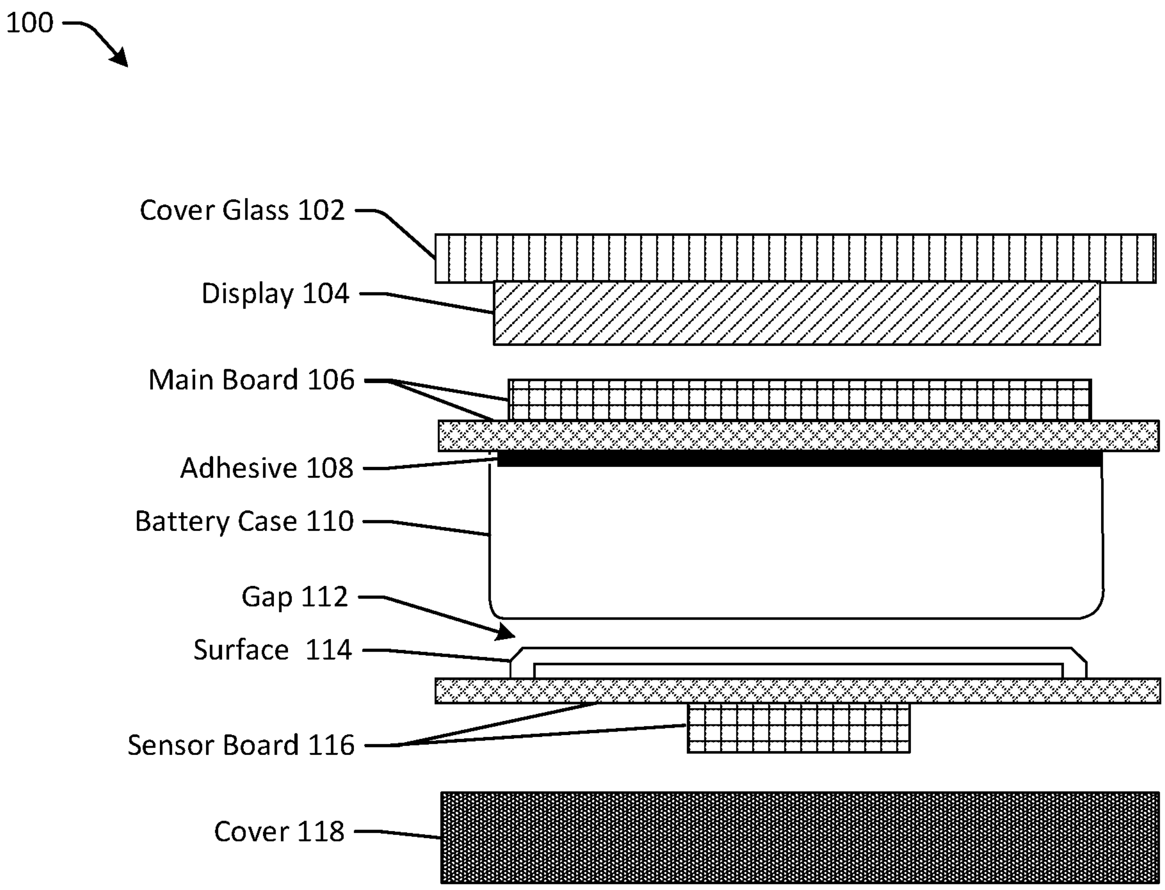
FIGS. 1 and 2 illustrate cross-sectional views of alternate example electronic devices comprising a battery having a conductive exterior and an electrically conductive surface disposed on an opposite side of a gap from the battery exterior.

As discussed above, a variety of events may result in degradation or failure of an electronic device. In rare cases, these failures may even rise to the level of presenting a safety hazard to a user of the electronic device. The techniques discussed herein include a system and processes for detecting an internal anomaly that may be indicative of such an event. These techniques may include using the conductivity of a battery case and an electrically conductive surface disposed on an opposite side of a gap from the battery case to detect such an anomaly. As discussed above, this gap may also serve to accommodate displacement of the battery, such as may be caused by nominal swelling. In some examples, the techniques described herein may be used to detect anomalies in devices with batteries having a metal can housing or case which is grounded (e.g., has 0V potential).

The system may comprise a circuit configured such that the battery case is connected to ground and includes a switch that operably connects the electrically conductive surface (e.g., such as a shield can, display enclosure, ground plate, heat sink, housing, or the like) to ground or, upon actuation of the switch, to a portion of the circuit including a resistor. The system may be configured to operate in two modes, depending on the state of the switch. In a nominal mode, the circuit and switch state are configured such that the electrically conductive surface is connected to the electrical ground. The circuit may also be configured to operate in an anomaly detection mode in which the switch is controlled to disconnect the surface from ground and connect the surface to a resistance measurement channel and a resistor that is connected to the sub-circuit and ground (i.e., parallel to the surface's connection to the resistance measurement channel). The system may determine an impedance across the resistor and may use the measured impedance to detect the existence of an anomalous event. In some examples, a microcontroller or other processing unit, such as an application-specific integrated circuit (ASIC), field-programmable gate array (FPGA), or the like, may control the switch and may determine the impedance of the surface (with the resistor connected).

If the impedance measured by the system equals the impedance value of the resistor, the anomaly detection system may determine and/or indicate that the electronic device is functioning normally and/or that no anomalous events have been detected in the gap. For example, a resistor having 100 kiloohms may be used and, so long as the impedance measured at the resistor equals 100 kiloohms (or a value that is within a tolerance range of 100 kiloohms, such as within 1 ohm of 100 kiloohms), the system may indicate that the electronic device/the gap is normal.

However, if the impedance measured by the system is less than the impedance value of the resistor or if no or nominal impedance is measured, the system may indicate/determine that an anomalous event has been detected. In some examples, the system may further determine an event type by classifying the anomalous event based at least in part on one or more ranges of impedances associated with different events. The classification may additionally or alternatively be based at least in part on sensor data received from a sensor of the electronic device or an indication set by the electronic device determined by other processes.

For example, the system may classify the anomaly as a first event type (a battery swelling event) based at least in part on determining that the measured impedance is zero. A zero impedance may be caused by the battery case contacting the shield can or other electrically conducive surface of the device, thereby causing a short circuit of the sub-circuit being tested by the resistance measurement channel. In another example, the system may classify the anomaly as a second event type (water ingress) based at least in part on determining that the measured impedance is within a first range of impedances, as a third event type (dust ingress) based at least in part on determining that the measured impedance is within a second range of impedances, or a fourth type event (loose part) if the impedance is variable over time.

For examples like the water ingress example, the classification of the second event type or third event type may be based at least in part on sensor data received from a hygrometer, accelerometer, thermistor, or the like, and/or based at least in part on an indication determined by a separate system of the electronic device. For example, the electronic device may determine that the device was dropped based at least in part on sensor data received from the accelerometer, which may increase a likelihood that water and/or dust ingress has occurred or that a part may have been jarred loose that may cause a short (e.g., an electronically conductive component, such as a screw or graphene filament).

If no anomalous event has been detected, the device may continue nominal operation. However, if the anomaly detection system detects an anomaly, the anomaly detection system may transmit an indication that an anomalous event has occurred and/or a type of the anomalous event. In some examples, this indication may be used to take remedial action and may be based at least in part on the event type, if an event type was determined. For example, the remedial action may include changing a charging profile, such as by changing a charging voltage and/or current; turning off an electronic device feature (e.g., powering down an accelerometer since the accelerometer may be broken); powering down the device; pausing or stopping a software process of the electronic device; transmitting a notification to a user interface indicating a remedial action for the user to take; transmitting a notification to a manufacturer or seller of the device; or the like.

Additionally or alternatively, the indication may be used by other systems of the electronic device, such machine-learned models or circuitry, that rely on the integrity of the electronic device, to downweight reliance on a feature. For example, if a drop event occurred or if a water ingress event was detected, the indication may be used to downweight sensor data received from a system that may be impacted by water ingress (e.g., a hygrometer, thermometer, camera) or a drop event (e.g., an accelerometer, camera). These sensors are merely given as examples and additional or alternate sensors may be identified as being impacted by different event types.

The system described herein may be used to detect, slow, and/or reverse battery swelling and may prevent degradation or failure of the electronic device. Moreover, the system may increase the safety of electronic devices by reducing the risk of leakage from the battery or fire caused by compromise of the battery. The system may also allow a user to take remedial action before further damage may be incurred and before the user may have become aware of such an event. For example, the techniques described herein may detect battery swelling, which left mitigated may cause pressure on next component(s) in a layer of the electronic device, such as a sensor board, a display, etc. Additionally or alternatively, the techniques described herein may detect damage caused by environmental stress, such as vibration, heat, and/or the like, which may cause an adhesive adhering the battery to another layer of the electronic device to delaminate, causing displacement of the battery.

This disclosure describes a battery anomaly detection system, including a circuit configured to detect anomalies based at least in part on a gap between a battery and another component as described herein. Additionally, this disclosure describes techniques for operating the battery anomaly detection system to detect anomalous events and, in some examples, classify such events.

Example Anomaly Detection System

In some examples, the battery anomaly detection system described herein may detect an anomalous condition in a gap between a battery and an electrically conductive surface of an electronic device. For example, the battery anomaly detection system may comprise an electrically conductive battery enclosure connected to electrical ground, the electrically conductive surface (disposed opposite the electrically conductive battery enclosure), and a switch operably connecting the electrically conductive surface to either a first resistor and a resistance measurement component or the electrical ground. In some examples, the first resistor may be connected to the electrically conductive surface and the electrical ground.

In some examples, the resistance measurement component may be configured to determine a measured impedance of a sub-circuit comprising the electrically conductive surface and the first resistor and indicate that an anomalous event has been detected based at least in part on determining that the measured impedance of the sub-circuit is less than a resistance of the first resistor. In additional or alternate examples, the resistance measurement component is further configured to indicate a nominal condition based at least in part on determining that the measured impedance of the sub-circuit equals the resistance of the first resistor (e.g., within a tolerance due to measurement sensitivity and/or resistor manufacturing tolerances).

In some examples, the switch of the battery anomaly detection system may disconnect the electrically conductive surface from the electrical ground by connecting the electrically conductive surface to the first resistor and the resistance measurement component. The switch may be controlled to open and the resistance measurement component may determine the measured impedance based at least in part on determining that a condition has been met. For example, the condition may include a passage of time; receiving a first indication that water ingress, case integrity event, or drop event has occurred; and/or receiving a second indication that the electronic device has been connected to a charger or is charging.

The battery anomaly detection system may further comprise a processing unit, in some examples. The processing unit may determine an anomaly event type based at least in part on determining that the measured impedance is zero or is within an impedance range associated with the anomaly event type, and/or causes execution of a remedial action based at least in part on at least one of the indication that the anomalous event has been detected or the anomaly event type. For example, the remedial action may comprise causing alteration at least one of a charging voltage or charging current associated with charging the electronic device, a change to a power use profile associated with operation of the electronic device, powering down the electronic device or a component of the electronic device; pausing or stopping a software process of the electronic device, and/or transmitting a notification to a user interface.

Example Anomaly Detection Process

In some examples, the battery anomaly detection system discussed herein may be execute/be operated according to a process comprising two modes. Such a process may be used where (an electrically conductive) surface is disposed opposite a battery enclosure and a gap may exist between the battery enclosure and the surface, and the battery enclosure and the surface may be part of an electronic device. In a first mode, the battery anomaly detection system may control a switch to connect a surface to an electrical ground. In a second mode, the battery anomaly detection system may control the switch to disconnect the surface from the electrical ground and to connect the surface to a resistance measurement component and a first resistor. During the second mode, the battery anomaly detection system may determine, by the resistance measurement component, an impedance of a sub-circuit comprising the surface and the first resistor; determine that the impedance is less than a resistance associated with the first resistor; and output an indication that an anomalous event has been detected based at least in part on determining that the impedance is less than the resistance. In some examples, the process executed by the battery anomaly detection system may further comprise determining to transition from the first mode to the second mode based at least in part on determining that a condition has been met, wherein the condition includes one or more of: a passage of time; receiving a first indication that water ingress, case integrity event, or drop event has occurred; or receiving a second indication that the electronic device has been connected to a charger or is charging. In some examples, the battery enclosure may be connected to ground during the first mode and the second mode; the first resistor is connected to the surface and the electrical ground; and the battery enclosure and the surface are electrically conductive.

In some examples, the process executed by the battery anomaly detection system may further comprise determining an anomaly event type associated with the anomalous event based at least in part on determining that the impedance is zero or within an impedance range; and/or causing execution of a remedial action based at least in part on the indication. The remedial action may comprise causing an alteration to at least one of a charging voltage or charging current associated with charging the electronic device; a change to a power use profile associated with operation of the electronic device; powering down the electronic device or a component of the electronic device; pausing or stopping a software process of the electronic device; and/or transmitting a notification to a user interface. In some examples, the anomaly event type may include: a battery swelling event; a water ingress event; a dust ingress event; a drop event; or a loose part event.

Example Electronic Device Configurations

Figure 2:
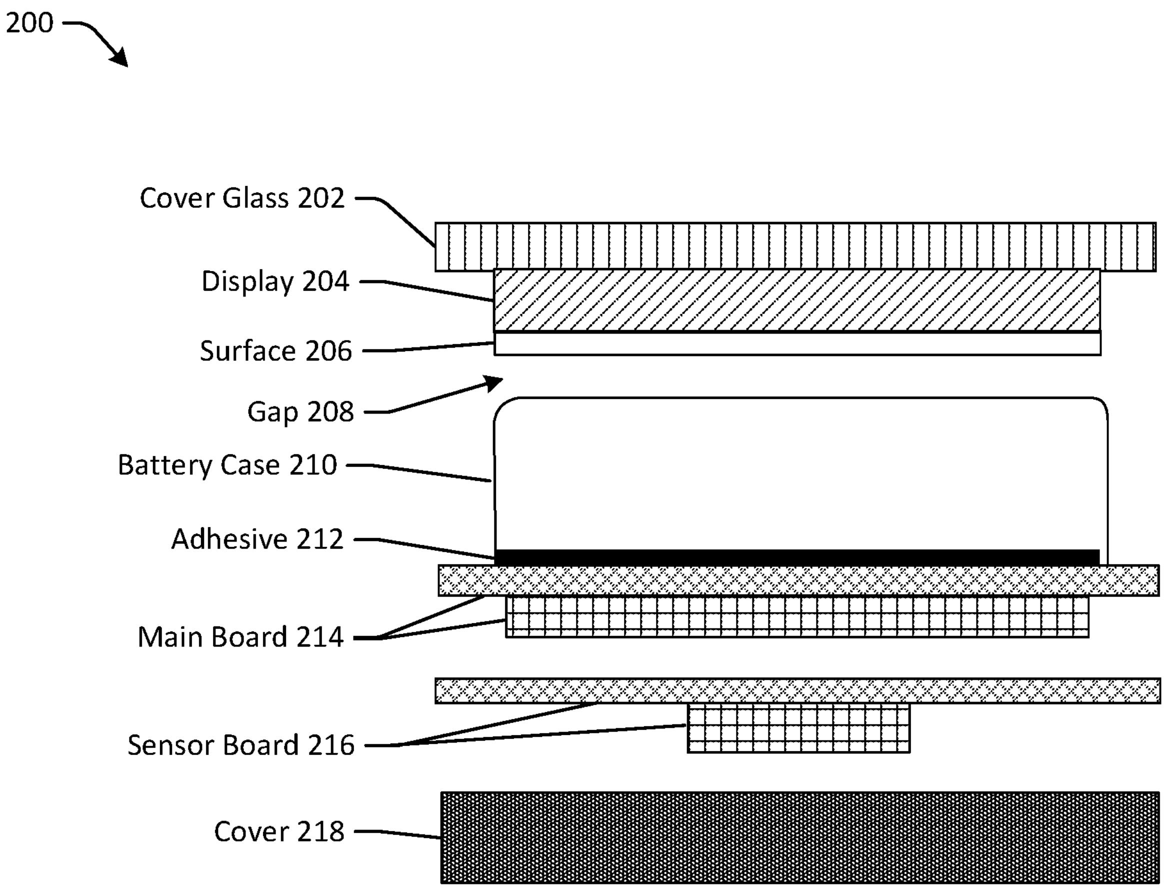

FIGS. 1 and 2 illustrate cross-sectional views of alternate example electronic devices comprising a battery having a conductive exterior and an electrically conductive surface disposed on an opposite side of a gap from the battery exterior. The electronic device discussed herein may include a wearable consumer electronic device, such as an extended reality wearable headset device, smart wrist band, haptic glove, smart ring device, or the like. Although the electronic devices discussed herein may include wearable electronic devices, it is understood that the techniques may be applied to different types of electronic devices that may include a gap between a battery exterior and an electrically conductive surface, such as a laptop, mobile phone, tablet, sports computer (e.g., a GPS computer), e-reader, handheld gaming console, gaming console, digital camera, electronic toy, security device, smart home device, or the like.

Turning to FIG. 1, an example electronic device 100 may comprise cover glass 102 disposed over a display 104, such as a liquid crystal display (LCD), light-emitting diode (LED) display, thin-film-transistor (TFT) LCD, organic LED (OLED) display, or the like. The electronic device 100 may further comprise a main board 106 (e.g., a motherboard or other circuit board), which may comprise a substrate and electronic components disposed thereon, such as various circuitry. For example, the main board 106 may be a printed circuit board (PCB) that includes processing unit(s) (e.g., central processing unit (CPU), graphics processing unit (GPU), microcontroller, embedded processor, signal processor (e.g., digital-to-analog converter (DAC), analog-to-digital converter (ADC)), application specific integrated circuit (ASIC), field-programmable gate array (FPGA), or the like), networking component(s) (e.g., radio frequency (RF) antenna and/or transmitter, RF integrated circuit (RFIC), signal booster), component interface(s) (e.g.), memory (e.g., solid state memory, flash memory), power component(s) (e.g., voltage rail, amplifier, driver, wireless charger), sensor (s) (e.g., accelerometer, gyroscope, lidar, radar, camera, optical heart rate sensor (e.g., photoplethysmography (PPG) sensor), thermometer, hygrometer), input/output device(s) (e.g., haptic sensor, microphone, speaker, camera, infrared transmitter), connector(s), heat sink, and/or the like.

In some examples, the main board 106 may include a processing unit, such as a microcontroller or IC for controlling the system discussed herein. In some examples, this processing unit or another processing unit may additionally or alternatively control the device charging profile. Any of these processing units may be operably coupled to a processing unit that controls a user interface, such as a graphical user interface presented via the display 104, an audio interface, a haptic interface, or the like. Such a user interface may include software and/or hardware sufficient to present a notification to a user of the electronic device, such as software and a speaker, display, and/or haptic device to visually, audibly, and/or haptically present a notification.

In some examples, adhesive 108 (e.g., pressure sensitive adhesive (PSA)) may adhere a battery case 110 to the main board 106. Leads from tabs on the battery may connect the battery to power rail(s) and/or a data tab on the battery may be connected to a circuit that controls a charging profile of the battery. The battery case 110 may be made of an electrically conductive material, such as a metal (e.g., steel, copper) doped silicate or polymer, graphite, or the like. For the sake of example and without limitation, the battery case 110 may include a steel can.

To afford tolerance in the size/displacement of the battery (e.g., due to battery swelling and/or degradation of the adhesive 108, such as may be caused by a drop event or age), the electronic device 100 may include a gap 112 between the battery and a next component in the cross-sectional layers of the electronic device 100. Depending on the type of battery and the swelling tolerances the gap may be an air or other gas gap of 0.5 millimeters, 1 millimeter, or any other suitable space to allow the battery to displace with age, heat, and the like.

A surface 114 disposed opposite the battery case 110 and across the gap 112 is electrically conductive according to the techniques described herein. For example, the surface 114 may be metallic, doped silicate or polymer, electroceramic material (e.g., graphite, indium tin oxide, doped ceramics, ceramics that are sufficiently hot to conduct electricity), or the like. For the sake of example and without limitation, the surface 114 may be the surface of a shield can for shielding radio frequency emissions and/or electromagnetic emissions. Such a shield can may be used to block or reduce electromagnetic waves from reaching a sensor board 116, as such waves may interfere with the operation of some components on the sensor board 116. Additionally or alternatively, the shield can may block or reduce emissions from reaching the main board 106.

The shield can/surface 114 may be disposed to prevent emissions from a sensor board 116 to the main board 106 or vice versa. In some examples, the sensor board 116 may comprise all of the sensors or at least some of the sensors of the electronic device 100, such as those that may malfunction in the presence of emissions present on the main board 106. In some examples, the sensor board 116 may include a PPG sensor, accelerometer, lidar, and/or any of the other sensors discussed herein. The electronic device 100 may further comprise a cover 118 that may be totally or partially opaque, totally or partially translucent (e.g., to allow an optical sensor to sense user biometrics), water-resistant or water-proof, dust-resistant or dust-proof, etc.

FIG. 2 illustrates an alternate example electronic device 200 that comprises a gap between a battery and an electronically conductive surface. The example electronic device 200 may comprise cover glass 202 and a display 204. In some examples, the display 204 may include a display enclosure that has an electrically conductive surface 206. The display enclosure itself may be electrically conductive or may have an electrically conductive surface applied thereto. There may be a gap 208 between the electrically conductive surface 206 and the battery case 210. The battery may be adhered with adhesive 212 to a main board 214 and the electronic device 200 may further comprise a sensor board 216 and/or cover 218.

Regardless of the particular configuration of an electronic device, the techniques may be applied to any electronic devices that include a battery with an electrically conductive enclosure/case disposed opposite an electrically conductive surface.

Example Battery Anomaly Detection System Configuration

Figure 3:
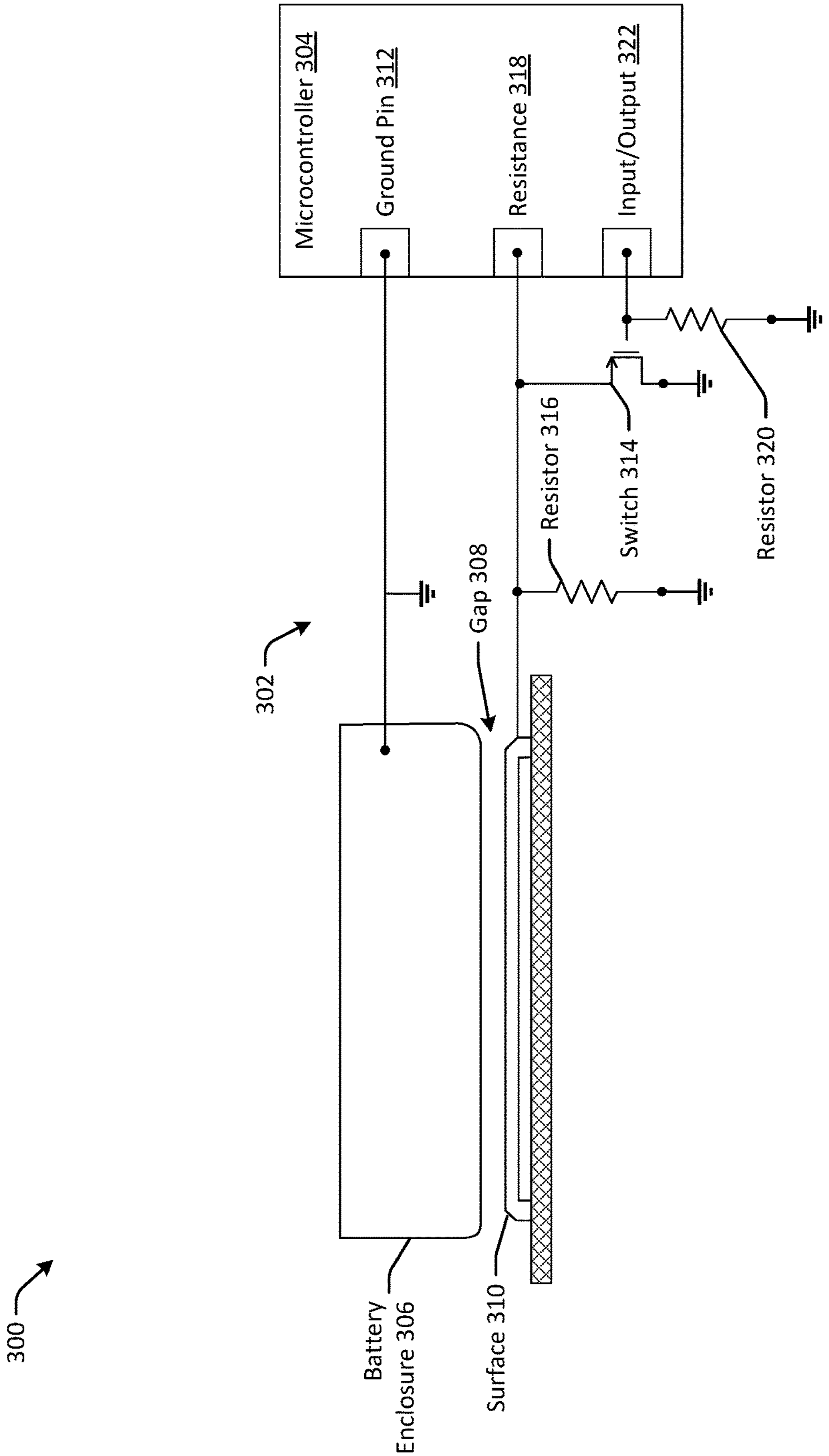
FIG. 3 schematically illustrates a battery anomaly detection system that includes a circuit and a microcontroller, in accordance with an example of the present disclosure.

FIG. 3 schematically illustrates a battery anomaly detection system 300 that includes a circuit 302 and a microcontroller 304 for detecting an anomalous event, in accordance with an example of the present disclosure. It is understood that, although a microcontroller is depicted in FIG. 3, any other suitable processing unit may be used, such as an ASIC, FPGA, or CPU. The system 300 may include a battery enclosure 306 that is electronically conductive a gap 308 and an electrically conductive surface 310. Battery enclosure 306 may represent battery case 110, battery case 210, or a battery enclosure of another electronic device. Gap 308 may represent gap 112, gap 208, or a gap of another electronic device. Surface 310 may represent surface 114, surface 206, or an electronically conductive surface of another electronic device.

The battery anomaly detection system 300 circuit 302 may include connecting the battery enclosure 306 to an electrical ground, such as by connecting the battery enclosure 306 to a ground pin 312 of the microcontroller 304, although other means exist to ground the battery enclosure 306.

The surface 310 is connected to ground via a switch 314. For example, the switch 314 may be a p-channel metal-oxide-semiconductor field-effect transistor (p-MOSFET). Alternatively, the switch 314 may be an n-channel MOSFET (n-MOSFET), complementary metal-oxide semiconductor (CMOS), insulated-gate bipolar transistor (IGBT), or any other programmable switch. However, the p-MOSFET may allow the circuit discussed herein to operate in a nominal mode without providing power to the switch 314.

The surface 310 is also connected to electrical ground via a resistor 316 and a resistance measurement channel 318 of the microcontroller 304. The resistor 316 may have a known channel and may be sufficiently large to differentiate between event types. For example, the resistor 316 may have an impedance of 100 kiloohms, although a resistor having a different impedance can be used—many other choices are suitable. The resistance measurement channel 318 of the microcontroller 304 may be configured to determine the current, voltage, and the impedance at the resistor 316 when the switch 314 is opened (powered on, in the example of a p-MOSFET). In examples where the switch 314 is a MOSFET, the surface 310 is also connected to the source of the MOSFET.

In examples where the switch 314 is a MOSFET, the drain of the MOSFET is connected to electrical ground and the gate is connected to electrical ground via a second resistor 320. The second resistor 320 may function as a pull-down resistor. The gate of the MOSFET is also connected to an input/output (I/O) pin 322 of the microcontroller 304, such as a general-purpose I/O pin of the microcontroller 304. The I/O pin 322 may be used to provide a low or high signal that switches the operation mode of the circuit 302. In an example where the switch 314 is a p-MOSFET, outputting a low signal at the I/O pin 322 will cause the surface 310 to be connected to ground (e.g., via the MOSFET drain). Outputting a high signal at the I/O pin 322 will cause the p-MOSFET to be powered on (the resistor 320 ensuring that the MOSFET is powered on), connecting the surface 310 to the resistance measurement channel 318 and allowing the resistance measurement channel 318 to determine the impedance of the circuit that, upon powering on the p-MOSFET, includes the resistor 316 in parallel with the connection of the surface 310 to the resistance measurement channel 318. If the switch 314 is an n-MOSFET, these operations would be reversed.

In some examples, the resistance measurement channel 318 may connect to a resistance measurement component (e.g., circuit and/or software) configured to output an indication of the impedance of the sub-circuit comprising the surface 310 and the first resistor 316. For example, the resistance measurement component may comprise comparator(s), voltage divider(s) (e.g., with an analog-to-digital converter in some examples), and/or the like.

Example Battery Anomaly Detection Processes

Figure 4:
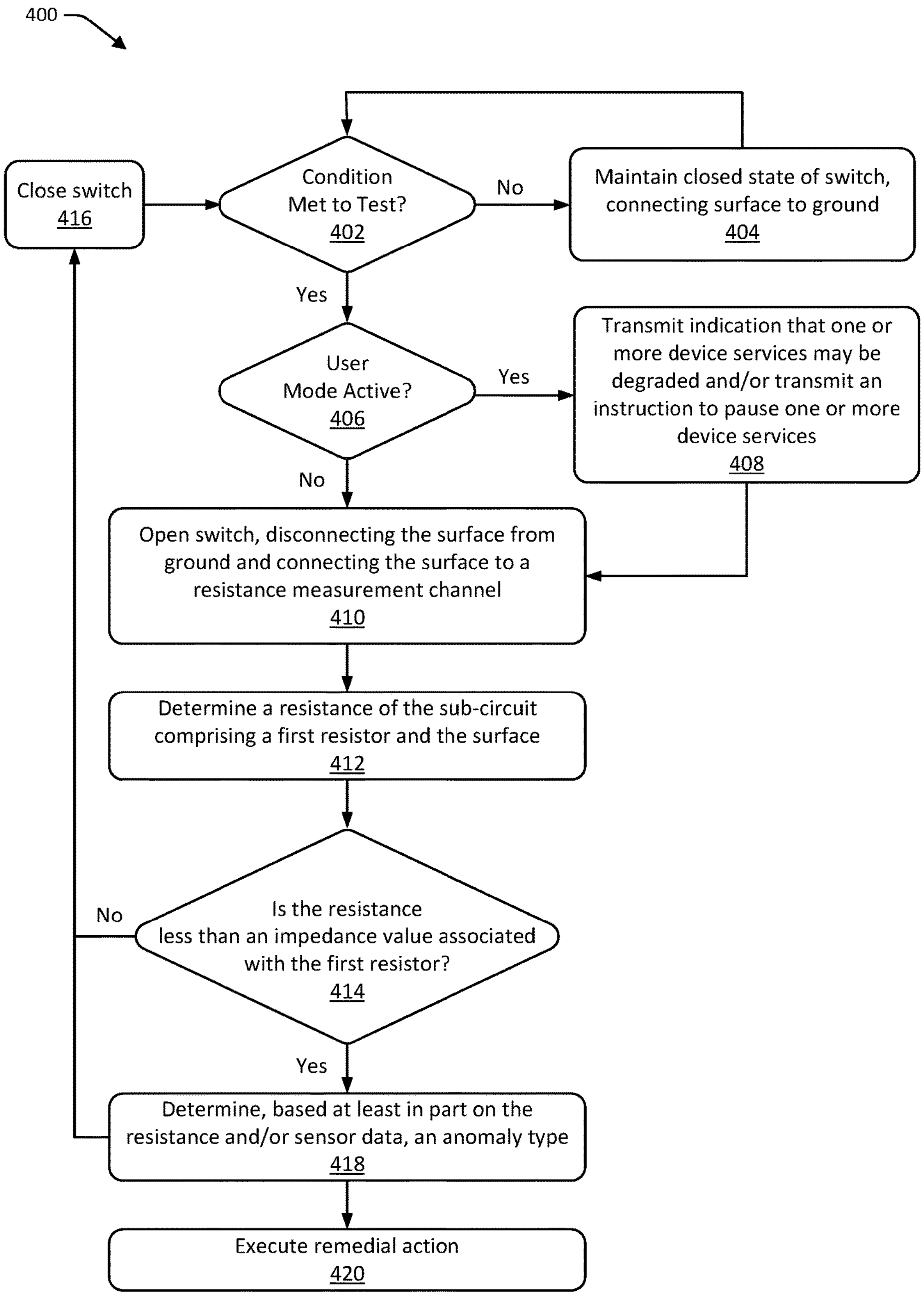
FIG. 4 illustrates a flow diagram of an example process illustrating aspects of techniques in accordance with examples as described herein.
Figure 5A:
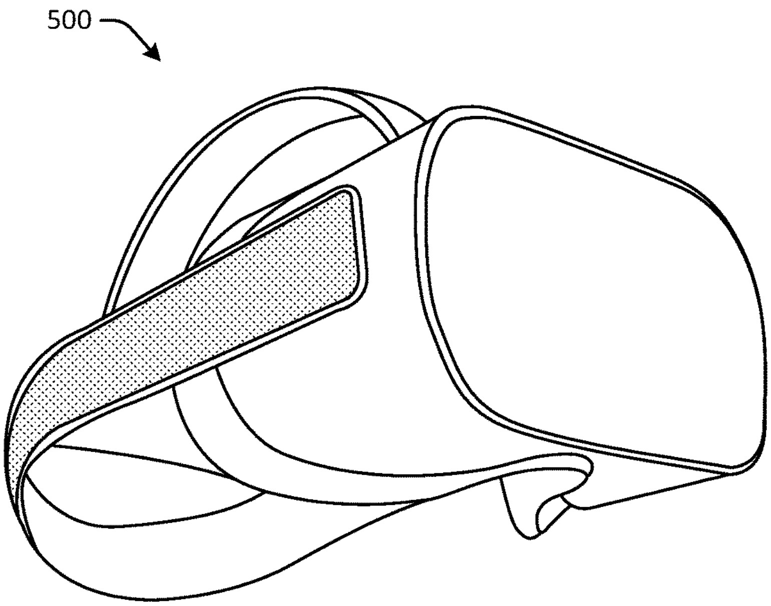
FIGS. 5A-5D schematically illustrate examples of electronic devices that may include one or more batteries and battery gaps, in accordance with examples of the present disclosure.
Figure 5B:
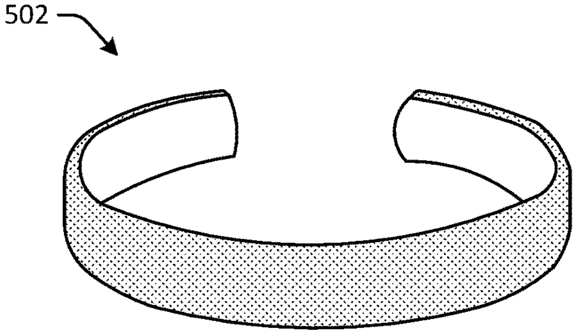
Figure 5C:
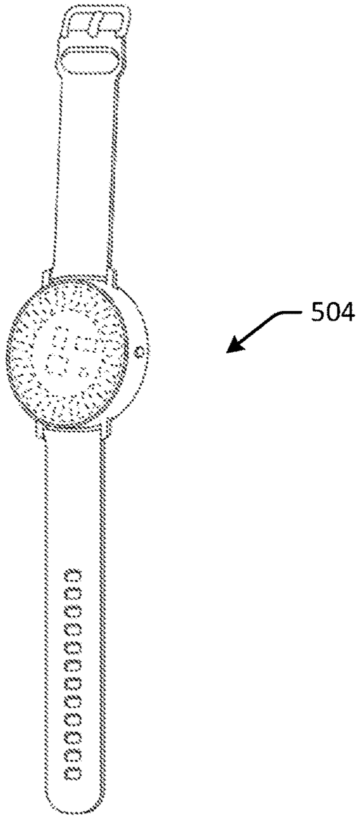
Figure 5D:
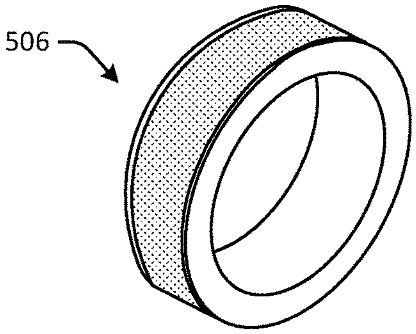

FIG. 4 illustrates a flow diagram of an example process 400 illustrating aspects of techniques in accordance with examples as described herein. The example process 400 may be conducted by a battery anomaly detection system, such as battery anomaly detection system 300.

At operation 402, example process 400 may comprise determining whether a condition has been satisfied to test for an anomaly, according to any of the techniques discussed herein. The battery anomaly detection system may operate in a nominal mode until a condition has been determined to be satisfied. For example, the microcontroller (or other processing unit) may determine whether a condition has been met. The condition(s) may include a time period (e.g., 1 hour, 5 hours, 30 minutes), determination that the device has been connected to a charger, determination that the device is charging, receiving an indication that another sensor has detected an event (e.g., a drop event as determined based at least in part on accelerometer data, water ingress event as determined based at least in part on accelerometer, case integrity, and/or hygrometer data), and/or the like. In some examples, the time period for testing for an anomaly in the battery gap may be different depending on a charging state of the battery. For example, the time period may be longer when the battery isn't charging (e.g., every 5 hours, every 1 hour), but that period may be shortened when the batter is charging (e.g., every 1 hour, every 30 minutes, every 15 minutes, every 10 minutes). Additionally or alternatively, the test may be conducted when the microcontroller receives an indication that the electronic device has been connected to a charger.

If a condition has not been met, example process 400 may transition to operation 404 ("No" prong, nominal operation mode). However, if a condition has been met, example process 400 may transition to operation 406 to test for an anomaly ("Yes" prong, anomaly detection mode).

At operation 402, example process 400 may comprise determining whether a user mode is active, according to any of the techniques discussed herein. In some examples, operation 406 may be an optional operation. Operation 406 may comprise determining an operating system state and/or power state associated with one or more processing units of the device. For example, operation 406 may comprise determining whether the electronic is in a powered on state, a hibernation state, a charging-only state (where the full operating system is not booted up), and/or whether the operating system is booted up. In an instance where the electronic device is fully powered on and the operating system is booted up, the example process 400 may transition to operation 408 ("Yes" prong); otherwise, example process 400 may transition to operation 410 ("No" prong).

At operation 408, example process 400 may comprise transmitting an indication that one or more device services may be degraded and/or an instruction to pause one or more device components and/or device services, according to any of the techniques discussed herein. For example, operation 408 may include setting a flag state, transmitting a notification to another processing unit of the electronic device, causing a device component to power down (e.g., turning off an accelerometer based at least in part on determining a drop event has occurred, turning off component(s) that may short circuit due to water ingress), or the like. According to the techniques discussed herein, testing for an anomaly may only last for a time period on the order of microseconds or a millisecond at most. However, the testing may interfere with the operation of certain electromagnetic-sensitive devices, such as sensors. The indication may be used by a processing unit of the electronic device to discount or otherwise downweight sensor data received from a sensor while the anomaly detection mode is active.

In some examples, the processing unit may additionally or alternatively pause services that rely on sensor data from such sensitive sensors. For example, a step-counting service, heart-rate display, or the like may have a 1 millisecond downtime where the service may maintain previous data and/or interpolate data based at least in part on previous sensor data, instead of relying on data from sensitive sensor (s) during the anomaly detection period. Operation 408 may be optional in some cases, since the anomaly detection mode may operate for a negligible amount of time compared to the sampling rate associated with any sensitive sensors (e.g., microseconds of anomaly detection compared to milliseconds or seconds at which a sensor may take measurements).

At operation 410, example process 400 may comprise opening the switch, thereby disconnecting the metal surface from ground and connecting the surface to a resistance measurement circuit, according to any of the techniques discussed herein. For example, if the switch is a p-MOSFET, this may comprising powering on the switch, thereby causing the p-MOSFET to disallow current to flow through the MOSFET to ground through the second resistor (resistor 320).

At operation 412, example process 400 may comprise determining an impedance of the sub-circuit comprising the surface 310 and the first resistor 316, according to any of the techniques discussed herein.

At operation 414, example process 400 may comprise determining whether the impedance of the sub-circuit is less than an impedance value associated with the first resistor 316, according to any of the techniques discussed herein.

If the measured impedance equals the impedance of the first resistor 316, example process 400 may transition to operation 416 ("No" prong) and/or the microcontroller may indicate that the battery air gap is in a nominal condition. In other words, if the measured impedance equals the impedance of the first resistor, within a tolerance range, no anomaly has been detected.

At operation 416, example process 400 may comprise closing the switch, thereby returning the system to a nominal operation mode, according to any of the techniques discussed herein.

However, if the measured impedance is less than the impedance of the first resistor 316, example process 400 may transition to operation 418 ("Yes" prong) and/or the microcontroller may indicate that an anomaly has been detected.

At operation 418, example process 400 may comprise determining, based at least in part on the resistance and/or other sensor data, an anomaly type, according to any of the techniques discussed herein. For example, the system may classify the anomaly as a first event type (a battery swelling event), based at least in part on determining that the measured impedance is zero. A zero impedance may be caused by the battery contacting the surface, thereby causing a short circuit of the sub-circuit being tested by the resistance measurement channel. In another example, the system may classify the anomaly as a second event type (water ingress) based at least in part on determining that the measured impedance is within a first range of impedances, as a third event type (dust ingress) based at least in part on determining that the measured impedance is within a second range of impedances, or as a fourth event type (loose part) based at least in part on determining that the measured impedance changes over time and/or that a variance of the impedance over time is greater than a threshold variance.

The impedance ranges associated with different events may be discrete/non-overlapping. In some examples, though, the impedance ranges may overlap, at least partially. In an example where the measured impedance is determined to be a within a portion of two impedance ranges that overlaps, secondary sensor data may be used to disambiguate the type of anomaly that is most likely to have occurred. For example, the second sensor data may comprise a case integrity failure indication, a hygrometer humidity value, a drop event and/or severity generated based at least in part on an accelerometer, an optical sensor reading, and/or the like. The sensor data used may depend on the anomaly types associated with the overlapping impedance ranges. For example, if the overlapping ranges are associated with a water ingress event and a dust ingress event, the secondary sensor data used to corroborate the water ingress event may comprise determining whether hygrometer data meets or exceeds a threshold humidity and/or the secondary sensor data used to corroborate the dust ingress event may comprise the case integrity failure indication and/or a drop event indication. Example process 400 may continue to operation 416 before or after operation 418 and may additionally transition to operation 420.

At operation 420, example process 400 may comprise executing a remedial action, according to any of the techniques discussed herein. If the anomaly detection system detects an anomaly, the anomaly detection system may transmit an indication that an anomalous event has occurred and/or a type of the anomalous event, if an anomaly event type was determined at operation 418. In some examples, this indication may be used by one or more processing unit(s) to take remedial action and may be based at least in part on the event type, if an event type was determined. For example, the remedial action may include changing a charging profile, such as by changing a charging voltage and/or current; turning off an electronic device feature (e.g., powering down an accelerometer since the accelerometer may be broken); changing a power use profile (e.g., reducing performance of the electronic device, such as by slowing a clock speed of a processor, reducing available processing units, or the like, and/or reducing the discharge of the battery); powering down the electronic device or one or more components of the electronic device; transmitting a notification to a user interface of the electronic device indicating a remedial action for the user to take; or the like.

Additionally or alternatively, the indication may be used by other systems of the electronic device, such machine-learned models or circuitry, that rely on the integrity of the electronic device, to downweight reliance on a feature. For example, if a drop event occurred or if a water ingress event was detected, the indication may be used to downweight sensor data received from a system that may be impacted by water ingress (e.g., a hygrometer) or a drop event (e.g., an accelerometer). These are only given as examples of anomaly types and additional or alternate anomaly events may exist and additional or alternate sensors may be impacted by the event examples given above.

Example Wearable Devices

FIGS. 5A-5D schematically illustrate examples of wearable electronic devices 500-506 that may include one or more batteries and battery gaps, such as those shown and described with reference to FIGS. 1-3. The example wearable electronic devices 500-506 include an extended reality wearable headset device 500, a smart wrist band 502, a smart watch 504, and a smart ring device 506, respectively. Any of the depicted electronic devices may comprise a microcontroller and circuit as discussed herein. Note that, although wearable devices are depicted in FIGS. 5A-5D, it is understood that the electronic device discussed herein may be any electronic device having the described electrically-conductive battery enclosure and surface and gap therebetween. For example, the electronic device may comprise a laptop, mobile phone, tablet, sports computer (e.g., a GPS computer), e-reader, handheld gaming console, gaming console, digital camera, electronic toy, security device, smart home device, or the like.

CONCLUSION

Although the discussion above sets forth example implementations of the described techniques, other architectures may be used to implement the described functionality and are intended to be within the scope of this disclosure.

Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method comprising:

in a first mode, controlling a switch to connect a surface to an electrical ground, wherein:

the surface is disposed opposite a battery enclosure and a gap exists between the battery enclosure and the surface, and the battery enclosure and the surface are part of an electronic device;

in a second mode, controlling the switch to disconnect the surface from the electrical ground and to connect the surface to a resistance measurement component and a first resistor;

during the second mode, determining, by the resistance measurement component, an impedance of a sub-circuit comprising the surface and the first resistor;

determining that the impedance is less than a resistance associated with the first resistor; and outputting an indication that an anomalous event has been detected based at least in part on determining that the impedance is less than the resistance.

2. The method of claim 1, further comprising at least one of:

determining an anomaly event type associated with the anomalous event based at least in part on determining that the impedance is zero or within an impedance range; or causing execution of a remedial action based at least in part on the indication.

3. The method of claim 2, comprising causing execution of the remedial action and wherein the remedial action comprises causing at least one of:

altering at least one of a charging voltage or charging current associated with charging the electronic device;

changing a power use profile associated with operation of the electronic device;

powering down the electronic device or a component of the electronic device;

pausing or stopping a software process of the electronic device; or transmitting a notification to a user interface.

4. The method of claim 2, wherein the anomaly event type includes:

a battery swelling event;

a water ingress event;

a dust ingress event;

a drop event; or a loose part event.

5. The method of claim 1, determining to transition from the first mode to the second mode based at least in part on determining that a condition has been met, wherein the condition includes one or more of:

a passage of time;

receiving a first indication that water ingress, case integrity event, or drop event has occurred; or receiving a second indication that the electronic device has been connected to a charger or is charging.

6. The method of claim 1, wherein:

the battery enclosure is connected to the electrical ground during the first mode and the second mode;

the first resistor is connected to the surface and the electrical ground; and the battery enclosure and the surface are electrically conductive.

7. A system for detecting an anomalous condition in a gap between a battery and an electrically conductive surface of an electronic device comprising:

an electrically conductive battery enclosure connected to electrical ground;

the electrically conductive surface disposed opposite the electrically conductive battery enclosure; and a switch operably connecting the electrically conductive surface to either a first resistor and a resistance measurement component or the electrical ground, wherein:

the resistance measurement component is configured to determine a measured impedance of a sub-circuit comprising the electrically conductive surface and the first resistor and indicate that an anomalous event has been detected based at least in part on determining that the measured impedance of the sub-circuit is less than a resistance of the first resistor.

8. The system of claim 7, wherein the resistance measurement component is further configured to indicate a nominal condition based at least in part on determining that the measured impedance of the sub-circuit equals the resistance of the first resistor.

9. The system of claim 7, wherein the switch disconnects the electrically conductive surface from the electrical ground by connecting the electrically conductive surface to the first resistor and the resistance measurement component.

10. The system of claim 7, wherein the first resistor is connected to the electrically conductive surface and the electrical ground.

11. The system of claim 7, further comprising a processing unit configured to at least one of:

determine an anomaly event type based at least in part on determining that the measured impedance is zero or is within an impedance range associated with the anomaly event type; or cause execution of a remedial action based at least in part on at least one of: the indication that the anomalous event has been detected or the anomaly event type.

12. The system of claim 11, wherein the remedial action comprises causing at least one of:

altering at least one of a charging voltage or charging current associated with charging the electronic device;

changing a power use profile associated with operation of the electronic device;

powering down the electronic device or a component of the electronic device;

pausing or stopping a software process of the electronic device; or transmitting a notification to a user interface.

13. The system of claim 7, wherein the switch is controlled to open and the resistance measurement component determines the measured impedance based at least in part on determining that a condition has been met, wherein the condition includes one or more of:

a passage of time;

receiving a first indication that water ingress, case integrity event, or drop event has occurred; or receiving a second indication that the electronic device has been connected to a charger or is charging.

14. An apparatus comprising:

a battery enclosure connected to electrical ground;

a surface disposed opposite the battery enclosure;

a gap between the battery enclosure and the surface; and a switch operably connecting the surface to either a first resistor and a resistance measurement component or the electrical ground, wherein:

the resistance measurement component is configured to determine a measured impedance of a sub-circuit comprising the surface and the first resistor and to indicate that an anomalous event has been detected based at least in part on determining that the measured impedance of the sub-circuit is less than a resistance of the first resistor.

15. The apparatus of claim 14, wherein the resistance measurement component is further configured to indicate a nominal condition based at least in part on determining that the measured impedance of the sub-circuit equals the resistance of the first resistor.

16. The apparatus of claim 14, wherein the switch disconnects the surface from the electrical ground by connecting the surface to the first resistor and the resistance measurement component.

17. The apparatus of claim 14, wherein:

the first resistor is connected to the surface and the electrical ground; and the surface is electrically conductive.

18. The apparatus of claim 14, further comprising a processing unit configured to at least one of:

determine an anomaly event type based at least in part on determining that the measured impedance is zero or is within an impedance range associated with the anomaly event type; or cause execution of a remedial action based at least in part on at least one of: the indication that the anomalous event has been detected or the anomaly event type.

19. The apparatus of claim 18, wherein the remedial action comprises causing at least one of:

altering at least one of a charging voltage or charging current associated with charging the apparatus comprising the battery enclosure and the surface;

changing a power use profile associated with operation of the apparatus;

powering down the apparatus or a component of the apparatus;

pausing or stopping a software process of the apparatus; or transmitting a notification to a user interface.

20. The apparatus of claim 14, wherein the switch is controlled to open and the resistance measurement component determines the measured impedance based at least in part on determining that a condition has been met, wherein the condition includes one or more of:

a passage of time;

receiving a first indication that water ingress, case integrity event, or drop event has occurred; or receiving a second indication that the apparatus has been connected to a charger or is charging.

* * * * *